US011984334B2

(12) United States Patent
Murai et al.

(10) Patent No.: US 11,984,334 B2
(45) Date of Patent: May 14, 2024

(54) ANOMALY DETECTION METHOD AND SYSTEM FOR MANUFACTURING PROCESSES

(71) Applicant: Accenture Global Solutions Limited, Dublin (IE)

(72) Inventors: Makoto Murai, Tokyo (JP); Shin Moriga, Tokyo (JP); Atsushi Suyama, Edogawa-ku (JP); Motoaki Hayashi, Shibuya-ku (JP); Takuya Kudo, Kirkland, WA (US)

(73) Assignee: Accenture Global Solutions Limited, Dublin (IE)

( * ) Notice: Subject to any disclaimer, the term of this patent is extended or adjusted under 35 U.S.C. 154(b) by 238 days.

(21) Appl. No.: 17/229,293

(22) Filed: Apr. 13, 2021

(65) Prior Publication Data

US 2022/0328332 A1 Oct. 13, 2022

(51) Int. Cl.
*H01L 21/67* (2006.01)
*G05B 19/418* (2006.01)
*G06N 20/00* (2019.01)

(52) U.S. Cl.
CPC .. *H01L 21/67276* (2013.01); *G05B 19/41875* (2013.01); *G05B 2219/32179* (2013.01); *G06N 20/00* (2019.01)

(58) Field of Classification Search
CPC ........ H01L 21/67276; G05B 19/41875; G05B 2219/32179; G05B 2219/32194;G05B 2219/37224; G06N 20/00; Y02P 90/02; G06Q 10/04; G06Q 10/06395; G06Q 50/04
See application file for complete search history.

(56) References Cited

U.S. PATENT DOCUMENTS 7,894,926 B2 * 2/2011 Lacaille ............. G05B 23/0232
 700/121
2006/0293775 A1 12/2006 Ono et al.
(Continued)

OTHER PUBLICATIONS

A. Behnia and et al, "Failure prediction and reliability analysis of ferrocement composite structures by incorporating machine learning into acoustic emission monitoring technique", Construction and Building Materials 122 (2016) 823-832 (Year: 2016).*
(Continued)

*Primary Examiner* — Douglas Kay
(74) *Attorney, Agent, or Firm* — Fish & Richardson P.C.

(57) ABSTRACT

The present disclosure describes a computer-implemented method for detecting anomalies during lot production, wherein the products within a production lot are processed according to a sequence of steps that include manufacturing steps and one or more quality control steps interspersed among the manufacturing steps, the method comprising: obtaining process quality inspection data from each of the one or more quality control steps for a first production lot; obtaining product characteristics data for the products in the first production lot after the final step in the sequence; training a Gaussian process regression model using the process quality inspection data and the product characteristics data from the first production lot; generating a predictive distribution of the product characteristics data using the Gaussian process regression model that uses a bathtub kernel function; obtaining process quality inspection data from each of the quality control steps for a second production lot; identifying anomalies in the second production lot using the predictive distribution of the product characteristics data and the process quality inspection data from the second production lot; if no anomalies are detected in the second production lot, updating the Gaussian process regression model using the process quality inspection data from
(Continued)

the second production lot; setting target values for one or more values in the process quality inspection data based on the predictive distribution of the product characteristic; and adjusting settings of one or more manufacturing steps based on the target values.

17 Claims, 8 Drawing Sheets

(56) References Cited

U.S. PATENT DOCUMENTS

| | | | | |
|---|---|---|---|---|
| 2008/0082197 | A1* | 4/2008 | Lacaille | G06N 5/043 700/121 |
| 2011/0213489 | A1* | 9/2011 | Lacaille | G06N 5/043 700/109 |
| 2016/0103089 | A1* | 4/2016 | Boyette | G01N 21/645 356/72 |
| 2018/0224347 | A1* | 8/2018 | Ishihara | G01L 9/125 |
| 2020/0257605 | A1* | 8/2020 | Suzuki | G06F 11/3006 |
| 2021/0066141 | A1* | 3/2021 | Phan | G06N 3/044 |

OTHER PUBLICATIONS

C. L. Jayasinghye and P. Zeephongsekul, "Local Polynomial Fitting of the Mean Residual Life Function", IEEE Transactions on Reliability, vol. 62, No. 2, Jun. 2013 (Year: 2013).*

EP Extended Search Report in European Appln. No. 22166598.7, dated Jun. 30, 2022, 10 pages.

* cited by examiner

ANOMALY DETECTION METHOD AND SYSTEM FOR MANUFACTURING PROCESSES

BACKGROUND

The present disclosure relates to manufacturing systems. Manufacturing systems process a workpiece according to a sequence of processing steps to manufacture a finished part. Quality control procedures are used throughout and following the sequence of processing steps to identify products that do not meet design or quality specifications. Some manufacturing systems augment data measured during quality control procedures with predictive methods to reduce defects and improve manufacturing efficiency.

SUMMARY

Implementations of the present disclosure are generally directed to methods and systems of detecting anomalies in lot production. More particularly, implementations of the present disclosure are directed to methods and systems based on a Gaussian process regression model that are used to detect anomalies in a particular product characteristic based on data from upstream, in-line quality control processes.

In some implementations, actions include obtaining process quality inspection data from each of one or more quality control steps for a first production lot; obtaining product characteristics data for the products in the first production lot after the final step in the sequence; training a Gaussian process regression model using the process quality inspection data and the product characteristics data from the first production lot; generating a predictive distribution of the product characteristics data using the Gaussian process regression model that uses a bathtub kernel function; obtaining process quality inspection data from each of the quality control steps for a second production lot; identifying anomalies in the second production lot using the predictive distribution of the product characteristics data and the process quality inspection data from the second production lot; if no anomalies are detected in the second production lot, updating the Gaussian process regression model using the process quality inspection data from the second production lot; setting target values for one or more values in the process quality inspection data based on the predictive distribution of the product characteristic; and adjusting settings of one or more manufacturing steps based on the target values. Other implementations of this aspect include corresponding systems, apparatus, and computer programs, configured to perform the actions of the methods, encoded on computer storage devices.

These and other implementations can each optionally include one or more of the following features: In some implementations, the operations further comprise defining the bathtub kernel as $$k(x_i,x_j)=\int \varphi(x,\theta)\varphi(x,\theta)d\theta,$$

where $\varphi(x, \theta)$ is a bathtub function and $\theta$ represents the parameters $\theta=[\alpha_1, \beta_1, \gamma_1, \alpha_2, \beta_2, \gamma_2, \delta]$, wherein the bathtub function can be expressed as $$\varphi(x,\theta)=\alpha_1 \cdot sig(\beta_1'x+\gamma_1)+\alpha_2 \cdot sig(\beta_2'x+\gamma_2)+\delta$$

wherein $\alpha_i$ determines the depth of the bathtub function, $\beta_i$ determines the steepness of the sides of the bathtub function, $\gamma_i$ determines the width of the bathtub function, and $\delta$ determines the overall height of the bathtub function, and the parameters are real numbers. In other words, if R denotes the set of all real numbers, $x \in R$, and $\alpha_1, \beta_1, \gamma_1, \alpha_2, \beta_2, \gamma_2, \delta \in R$.

Some implementations comprise comparing a credible interval for the predictive distribution of the product characteristics data to a pre-determined threshold; and if the credible interval is above the threshold, using the process quality inspection data for the second production lot to train the Gaussian process regression model without identifying anomalies in the second production lot. Some implementations comprise generating a skipped announcement that includes the process quality inspection data for the second production lot. Some implementations comprise obtaining product characteristics data for the products in the second production lot after the final step in the sequence; determining a difference between the predictive distribution of the product characteristics data and the obtained product characteristics data; comparing the difference to a pre-determined threshold; and triggering an alarm if the difference is larger than the pre-determined threshold. Some implementations comprise updating the Gaussian process regression model using the process quality inspection data and the product characteristics data from the second production lot if the difference is smaller than the pre-determined threshold. Some implementations comprise identifying process quality inspection data to be learned in order to refine the predictive distribution of the product characteristic; adjusting settings of one or more manufacturing steps based on the identified process quality inspection data; acquiring the identified process quality inspection data; and training the Gaussian process regression model using the acquired process quality inspection data. Some implementations comprise obtaining the product characteristics data by wafer testing in a wafer fabrication process.

It is appreciated that methods in accordance with the present disclosure can include any combination of the aspects and features described herein. That is, for example, apparatus and methods in accordance with the present disclosure are not limited to the combinations of aspects and features specifically described herein, but also may include any combination of the aspects and features provided.

The details of one or more implementations of the present disclosure are set forth in the accompanying drawings and the description below. Other features and advantages of the present disclosure will be apparent from the description, drawings, and claims.

BRIEF DESCRIPTION OF DRAWINGS

Like reference numbers and designations in the various drawings indicate like elements.

DETAILED DESCRIPTION

Implementations of the present disclosure are generally directed to methods and systems of detecting anomalies in lot production. More particularly, implementations of the present disclosure are directed to methods and systems based on a Gaussian process regression model that are used to detect anomalies in a particular product characteristic based on data from upstream, in-line quality control processes.

In some implementations, actions include obtaining process quality inspection data from each of one or more quality control steps for a first production lot; obtaining product characteristics data for the products in the first production lot after the final step in the sequence; training a Gaussian process regression model using the process quality inspection data and the product characteristics data from the first production lot; generating a predictive distribution of the product characteristics data using the Gaussian process regression model that uses a bathtub kernel function; obtaining process quality inspection data from each of the quality control steps for a second production lot; identifying anomalies in the second production lot using the predictive distribution of the product characteristics data and the process quality inspection data from the second production lot; if no anomalies are detected in the second production lot, updating the Gaussian process regression model using the process quality inspection data from the second production lot; setting target values for one or more values in the process quality inspection data based on the predictive distribution of the product characteristic; and adjusting settings of one or more manufacturing steps based on the target values.

Implementations of the present disclosure are described in further detail herein with reference to an example manufacturing system. The example manufacturing system is used to process wafers that are used to fabricate semiconductor devices. A semiconductor device fabrication process is used to manufacture stand-alone semiconductor devices and integrated circuit chips, for example. The fabrication process includes a sequence of automated steps that gradually form electronic circuits on a semiconductor wafer. Due to the number of steps, the fabrication process can take several weeks from start to finish. It is contemplated, however, that implementations of the present disclosure can be realized with any appropriate automated system that includes multiple manufacturing process that result in quality control data.

Figure 1:
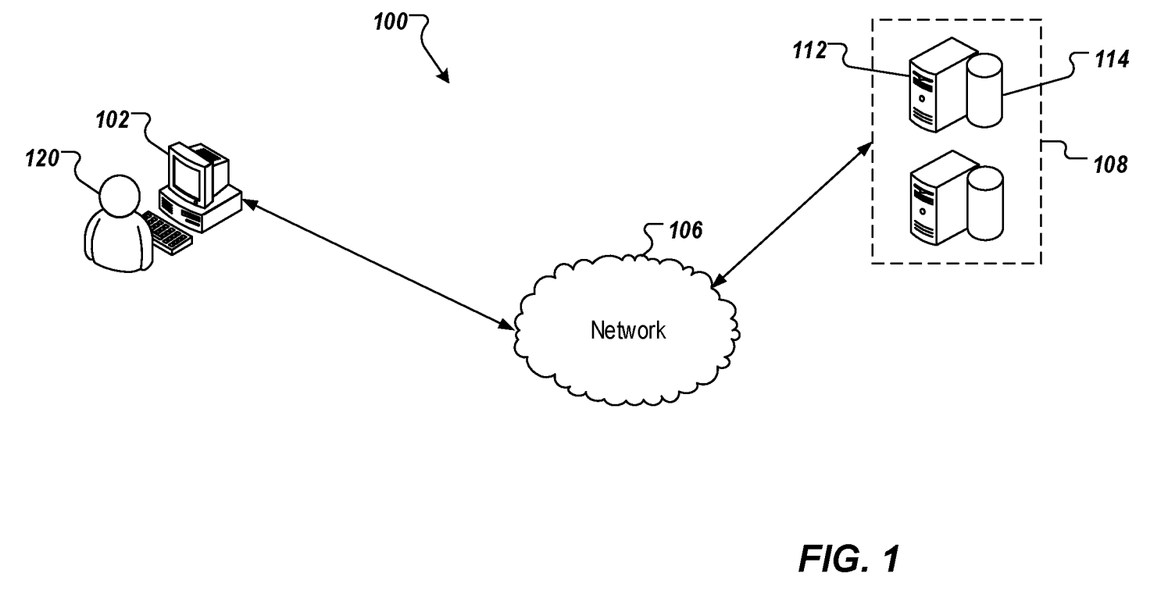
FIG. 1 depicts an example system that can execute implementations of the present disclosure.

FIG. 1 depicts an example system 100 that can execute implementations of the present disclosure. The example system 100 includes a computing device 102, a back-end system 108, and a network 106. In some examples, the network 106 includes a local area network (LAN), wide area network (WAN), the Internet, or a combination thereof, and connects web sites, devices (e.g., the computing device 102), and back-end systems (e.g., the back-end system 108). In some examples, the network 106 can be accessed over a wired and/or a wireless communications link.

In some examples, the computing device 102 can include any appropriate type of computing device such as a desktop computer, a laptop computer, a handheld computer, a tablet computer, a personal digital assistant (PDA), a cellular telephone, a network appliance, a camera, a smart phone, an enhanced general packet radio service (EGPRS) mobile phone, a media player, a navigation device, an email device, a game console, or an appropriate combination of any two or more of these devices or other data processing devices.

In the depicted example, the back-end system 108 includes at least one server system 112, and data store 114 (e.g., database and knowledge graph structure). In some examples, the at least one server system 112 hosts one or more computer-implemented services that users can interact with using computing devices. For example, the server system 112 can host one or more applications that are provided as part of an anomaly detection system in accordance with implementations of the present disclosure.

In some examples, the back-end system 108 hosts an anomaly detection system that detects anomalies in a manufacturing system in accordance with implementations of the present disclosure. For example, a user 120 (e.g., an operator in a semiconductor fabrication plant) can interact with the anomaly detection system using the computing device 102.

Figure 2:
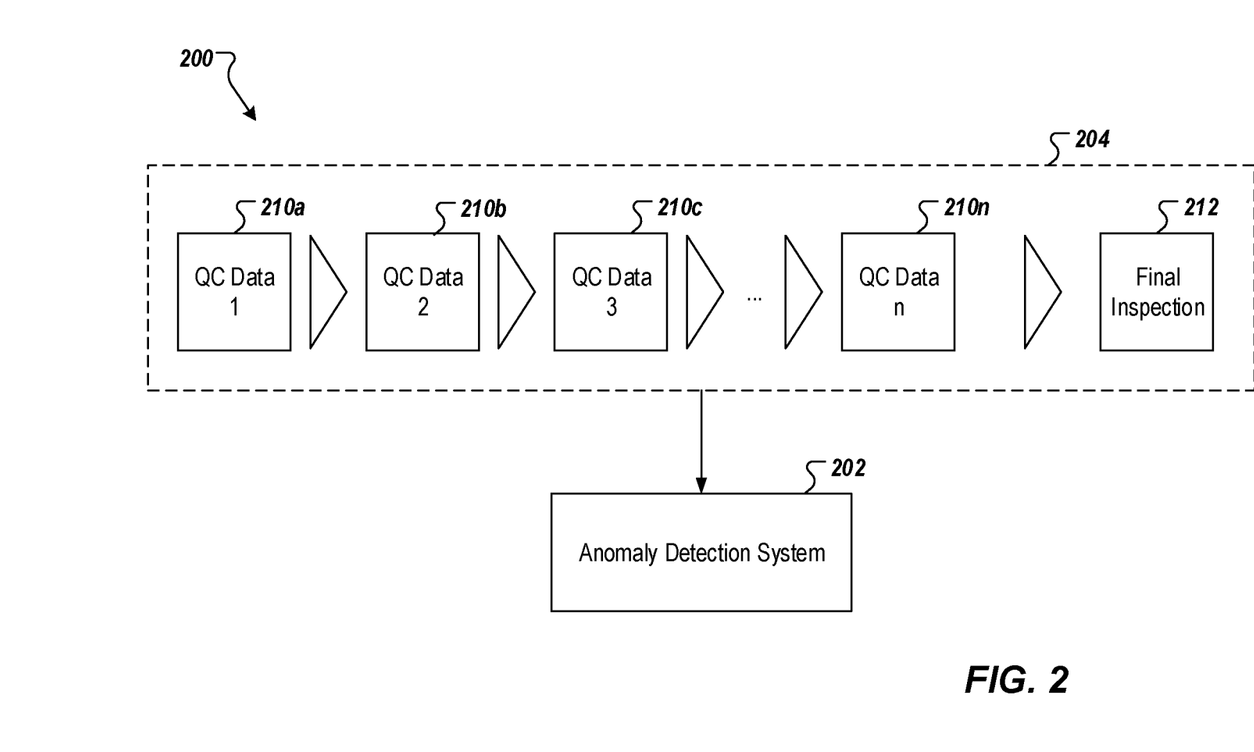
FIG. 2 depicts an example system that monitors quality in a manufacturing process such as a semiconductor device fabrication process

FIG. 2 depicts an example system 200 that monitors quality in a manufacturing process such as a semiconductor device fabrication process. For example, the manufacturing process may relate to wafer fabrication, in which sequential processes form electronic circuits on a semiconductor wafer. The system 200 includes an anomaly detection system 202 that receives quality control data 204. The anomaly detection system 202 is described in further detail in reference to drawings FIGS. 3 to 9.

The quality control data 204 includes data that is collected as part of the wafer fabrication process. Wafer fabrication includes four broad categories of processing steps: deposition, removal, patterning, and the modification of electrical properties. These processing steps are performed at specific areas on the wafer and repeated hundreds of times to form the finished circuit. In addition to the processing steps, wafer fabrication includes in-line quality control steps that are interspersed between the processing steps.

At each in-line quality control step, one or more parameters are measured and compared to respective thresholds (e.g., upper limit, lower limit). If the value falls outside of these limits, the wafer is deemed defective. Wafers whose values fall into the predetermined range proceed to the next processing step. For example, a first set 210a of quality control data 1 includes the values for the wafers that "passed" the first in-line quality control step (not shown). These wafers continue until the next in-line quality control step, where a second set 210b of quality control data 2 is collected for the wafers that "pass" the second in-line quality control step. The in-line quality control continues until a final nth set 210n of quality control data n is collected. For the sake of simplicity, FIG. 2 includes four sets 210a, 210b, 210c, 210n of quality control data. In practice, the number of sets of data is adjusted to the specific wafer fabrication process.

Generally speaking, there are two types of quality control data. The first type includes continuous variables, for example, length, weight, thickness, temperature, strength, component percentage, and time. Continuous variables can take on two real values and also all real values that lie between the two values. This category can also include simple measurements, such as, dimensions, surface roughness, length, volume, mass, time, and energy. This category can further include measurement classification values and multi-measurement values. The second type of data include data obtained by counting, for example, the number of defective products. This can include the number of defective units, defective locations, a defect rate, a number of units produced, number of personnel, to name a few. In other words, the second category includes discrete variables. This category further includes simple total values, such as the number of failures or the number of defective products. The category also includes counting classification values and multiple total values.

Wafer fabrication generally ends in a wafer testing step that tests the circuits on the wafer for functional defects according to a sequence of test patterns. After wafer testing, the wafer may continue on to further fabrication steps, such as die preparation. The quality control data 204 also includes final inspection data 212 from wafer testing, e.g., whether a particular wafer has passed all test patterns. In order to proceed to wafer testing, a wafer will have "passed" each of the in-line quality control steps. However, not all of these wafers will pass the wafer test. According to implementations of the present disclosure, the anomaly detection system 202 analyzes the quality control data 204 to identify such wafers.

Figure 3:
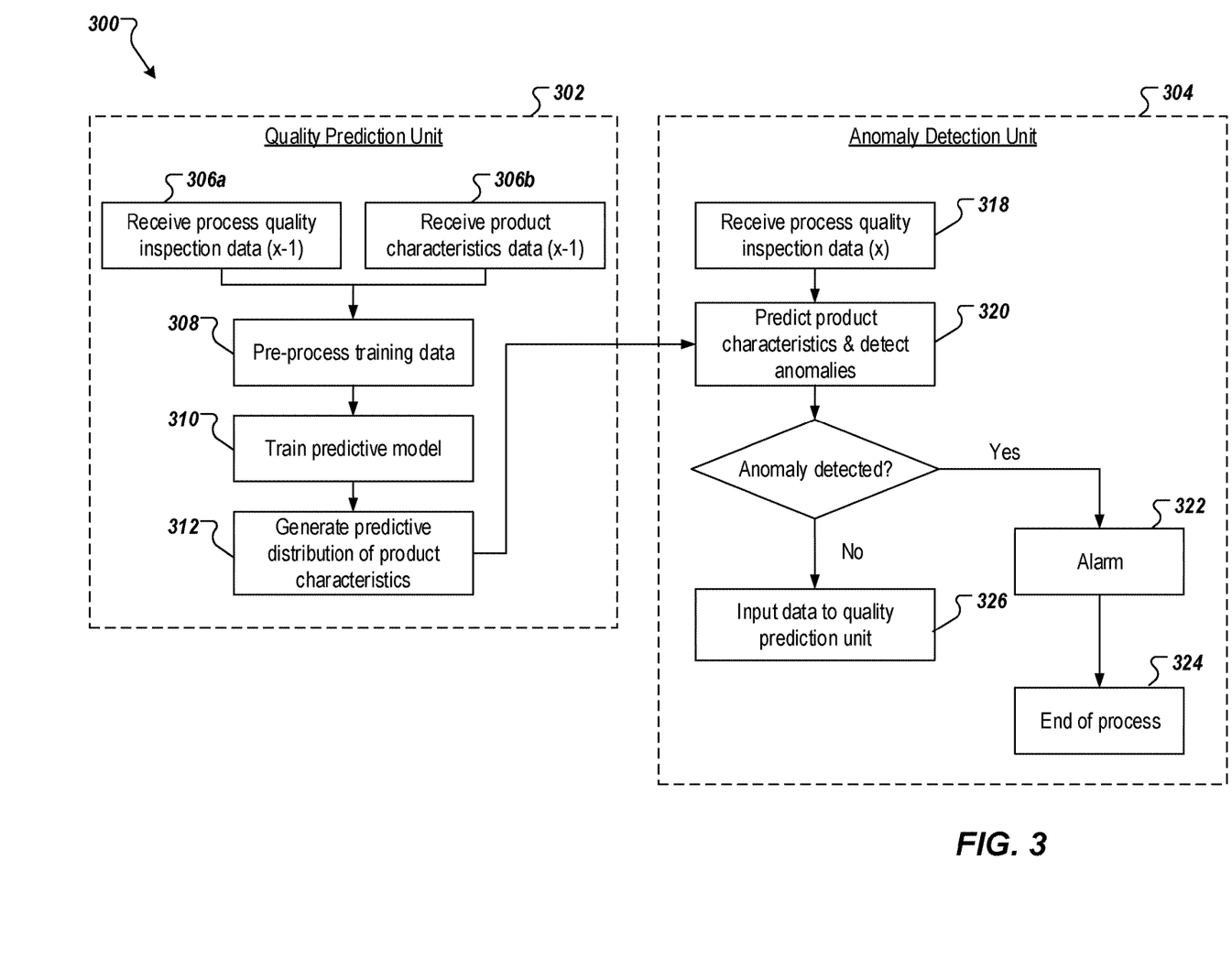
FIG. 3 depicts an example of an anomaly detection system in accordance with implementations of the present disclosure.

FIG. 3 depicts an example of an anomaly detection system 300 that can be used in system 200 of FIG. 2. The anomaly detection system 300 includes a quality prediction unit 302 and an anomaly detection unit 304. The quality prediction unit 302 generates a predictive distribution of product characteristics. The predictive distribution serves as input for the anomaly detection unit 304, which identifies anomalies based on process quality inspection data. Use of the term "product characteristics" throughout this disclosure refers to the values or parameters obtained during a final inspection step (e.g., the final inspection data 212 from wafer testing). Use of the term "process quality inspection data" throughout this disclosure refers to the values or parameters obtained during in-line quality control testing (e.g., sets 210a, 210b, 210c, 210n of quality control data).

The quality prediction unit 302 is configured to execute a sequence of steps that results in a predictive distribution of product characteristics. At 306a, the quality prediction unit 302 obtains process quality inspection data from each of the one or more quality control steps for a first production lot. At 306b, the quality prediction unit 302 obtains product characteristics data for the products in the first production lot after the final step in the sequence of manufacturing and quality control steps. In the figures, use of the notation "x−1" refers to past data (from the first production lot) that are used to train the predictive model. When the anomaly detection system 300 is initially established, past data may be historical production data that is stored in on a server (e.g., back-end system 108 in FIG. 1). Once the system 300 is operational, past data may be data from a previous batch or lot. In some cases, wafers are fabricated in a fixed lot size, e.g., 25 wafers to reduce the cost of fabrication. The past data may include the data from a previously manufactured lot. Alternatively, the past data may group earlier quality control data in a manner that does not strictly correspond to production lots.

At 308, the past process quality inspection data and product characteristics data are pre-processed to form a training set. For example, data pre-processing can include data formatting and data quality assurance using any suitable method. At 310, the training data are used to train a predictive model. The predictive model is a Gaussian process regression model that uses a bathtub kernel function, as described in more detail in reference to FIGS. 4 and 5. A Gaussian process model can be trained by approximate inference, for example, using matrix or numerical computation. Generally, the probability distribution of the parameters is adjusted so that the probability of generating data for training is increased.

At 312, the predictive model is used to generate a predictive distribution of the product characteristics that serves as input for the anomaly detection unit 304. The predictive distribution output using the bathtub model corresponds to the range of possible probabilities for the value of the output. For example, in a two-dimensional example, when (QC1, QC2)=(10, 15), the predicted value of the final quality data is between 50 and 65 with a probability of 80%. In this case, if the actual final quality data obtained is 98, the anomaly score will be high because it is far from 50~65.

The anomaly detection unit 304 is configured to execute a sequence of steps that uses the predictive distribution of the product characteristics to identify anomalies based on process quality inspection data. At 318, the anomaly detection unit 304 obtains process quality inspection data from each of the quality control steps for a second production lot. In other words, the anomaly detection unit 304 receives process quality inspection data of the wafers to be inspected, e.g., of lot x. At 320, the process quality inspection data are compared to the predictive distribution generated by the quality prediction unit 302 to detect anomalies within the process quality inspection data x, e.g. by comparing the process quality inspection data to the output range as described above. If one or more anomalies are detected, an alarm is sounded at 322, and the process is ended at 324 to allow for review by the operator. If no anomalies are detected, the process quality inspection data x is sent to the quality prediction unit 302 at 326 to update the predictive model.

Figure 4:
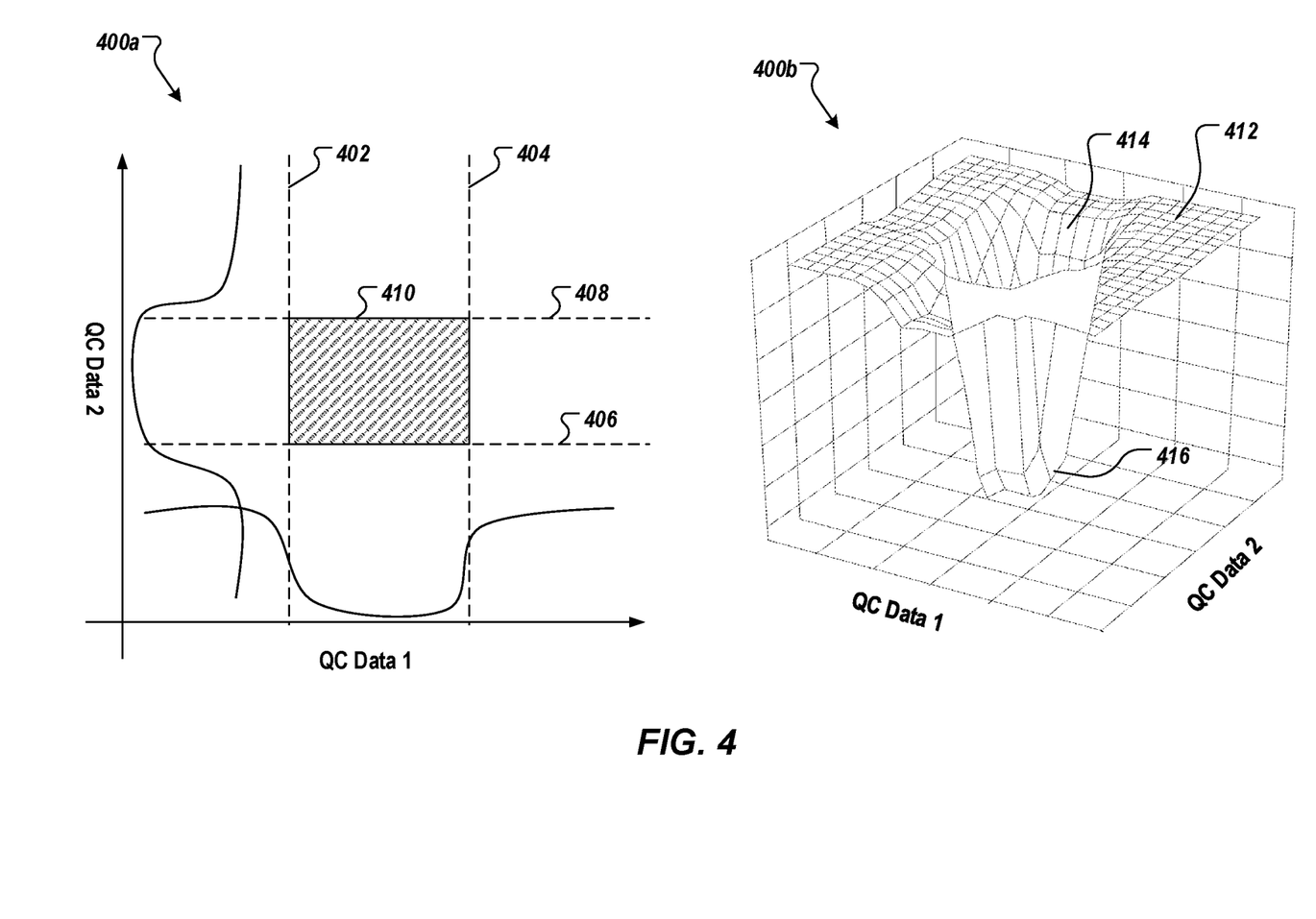
FIG. 4 depicts an example of a predictive model in accordance with implementations of the present disclosure.

FIG. 4 depicts an example of a predictive model in two dimensions. Both models 400a, 400b receive two sets of process quality inspection data as input. The first set of data has pre-defined upper and lower limits 402, 404. The second set of data also has pre-defined upper and lower limits 408, 406. The limits 402, 404, 406, 408 define a process window 410 into which the individual values of the process quality inspection data should fall. As shown by the two curves in the model 400a, the prediction model is a Gaussian process regression model that uses a bathtub kernel function. Although FIG. 4 depicts a two-dimensional model for QC Data 1 and QC Data 2, the model can be expanded to several dimensions (i.e., QC Data 1, QC Data 2, . . . QC Data n).

In Gaussian process regression, when the likelihood, i.e., the observed distribution of the training data, is normal, the posterior distribution of the function is calculated by matrix calculation. When the observed distribution is non-normal, the posterior distribution of the function is calculated by approximate calculations such as the Markov chain Monte Carlo method or the expected value propagation method. The model calculates the predictive distribution, which is the product of the posterior distribution of the function and the likelihood, i.e., the observed distribution, marginalized by the function.

In the present disclosure, an anterior bathtub kernel is defined as $$k(x_i, x_j) = \int \varphi(x, \theta) \varphi(x, \theta) d\theta,$$

where $\varphi(x, \theta)$ is a bathtub function and $\theta$ represents the parameters $\theta = [\alpha_1, \beta_1, \gamma_1, \alpha_2, \beta_2, \gamma_2, \delta]$. The bathtub function can be expressed as $$\varphi(x, \theta) = \alpha_1 \cdot sig(\beta_1' x + \gamma_1) + \alpha_2 \cdot sig(\beta_2' x + \gamma_2) + \delta.$$

In other words, the bathtub function corresponds to two connected sigmoid functions. This single formula can eliminate the need for detailed modeling for the process quality inspection data collected at each in-line quality control step, e.g., sets 210a, 210b, 210c, 210n in FIG. 2. The interaction between the parameters θ determines how narrow the margin range in the bathtub-type margin design is. The parameters θ can be determined based on the user's knowledge, by calculating optimal values from the data, by calculating the parameters as a posterior distribution from the data, or by cross-validation, which divides the data.

In addition to the two dimensions corresponding to QC Data 1 and QC Data 2, the model 400b also shows the depth, which includes a flat, upper portion 412, an opening 414 that approximates the process window 410, and a bottom 416. The depth expresses the output of the model, i.e., the values of the product characteristics data. Since the opening 414 corresponds to the location of the process window 410, values that are not anomalies are located within the opening 414 of the bathtub model 400b. In contrast, anomalies are located on the upper portion 412. In order to represent the models 400a, 400b on paper, FIG. 4 includes two sets of process quality inspection data. However, if the models 400a, 400b are adapted to system 200 of FIG. 2, then the model input will be n-dimensional to match the n sets of process quality inspection data.

The relationship between process quality inspection data and product characteristics data can take on a very complex non-linear relationship. For example, there may be an event where product characteristics deteriorate sharply in response to an increase in process quality inspection data values. A Gaussian process regression model can quantitatively represent such complex relationships by interpolating between the acquired data points used to train the model. The resulting predictive distribution of product characteristics can be used to set target values for the process quality inspection data that result in optimized values for the product characteristics.

Since the product characteristics are represented by a probabilistic model, only a small number of data points are required to obtain a reliable model. Specifically, one of the features of Gaussian process regression is that it is possible to calculate the probability distribution of predictions with an uncertainty that depends on the amount of data. In other words, even in the relatively early stages of production, when the amount of training data is relatively small, predictions can be made with at a relatively low degree of confidence and applied to production management. Thus, the system of the present disclosure can be used from an early stage in the manufacturing lifecycle.

Figure 5:
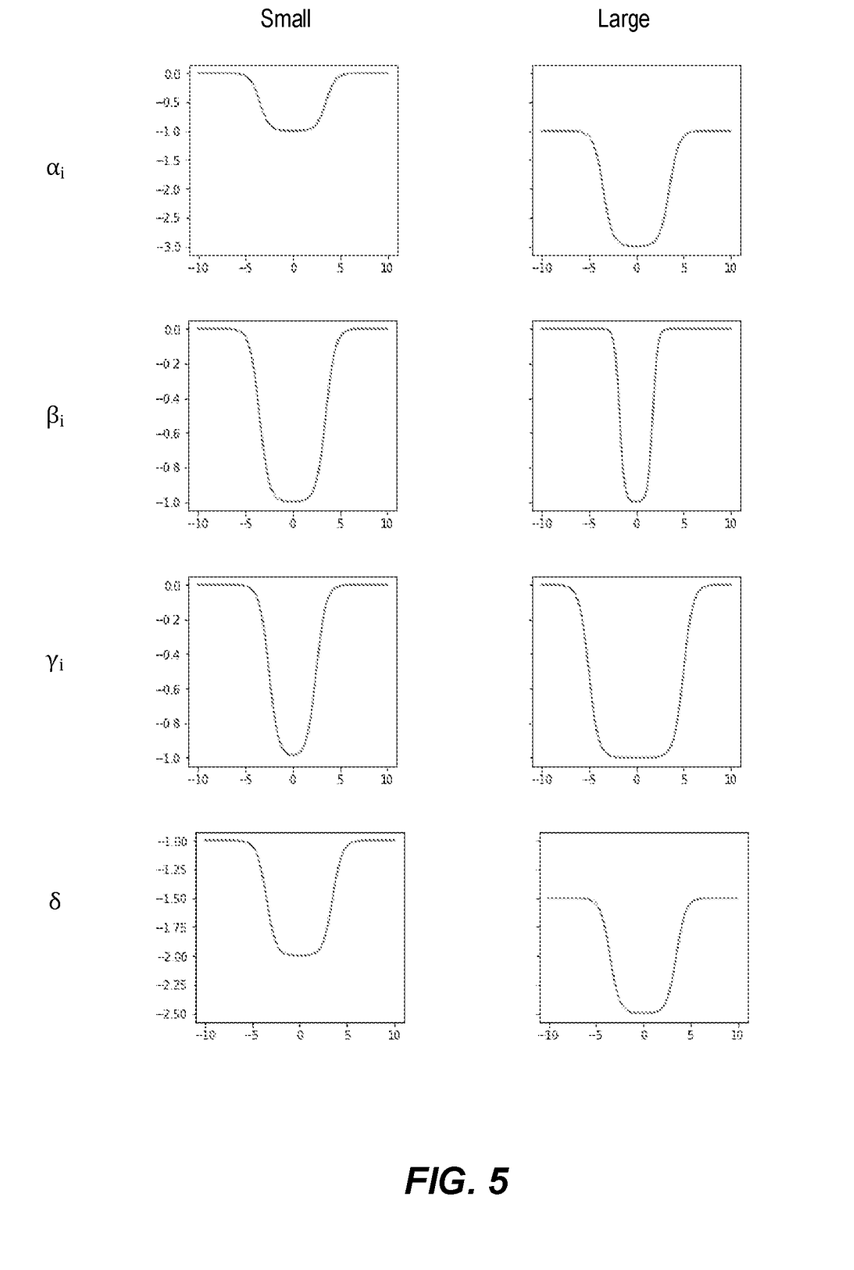
FIG. 5 depicts various parameters of a bathtub function in accordance with implementations of the present disclosure.

FIG. 5 depicts various examples of the parameters θ[$\alpha_1$, $\beta_1$, $\gamma_1$, $\alpha_2$, $\beta_2$, $\gamma_2$, $\delta$] of the bathtub function. Specifically, the depth of the bathtub is represented by the parameter $\alpha_i$. The steepness of the walls of the bathtub is represented by the parameter $\beta_i$. The width of the bathtub is represented by the parameter $\gamma_i$. The overall height of the bathtub is represented by the parameter $\delta$. Various bathtub shapes can be designed by combining these four parameters. Optimal parameter distributions are obtained automatically by inferring Gaussian processes. Since the associations with the parameters are easy to grasp, the analysis results are easy to interpret and apply.

Figure 6:
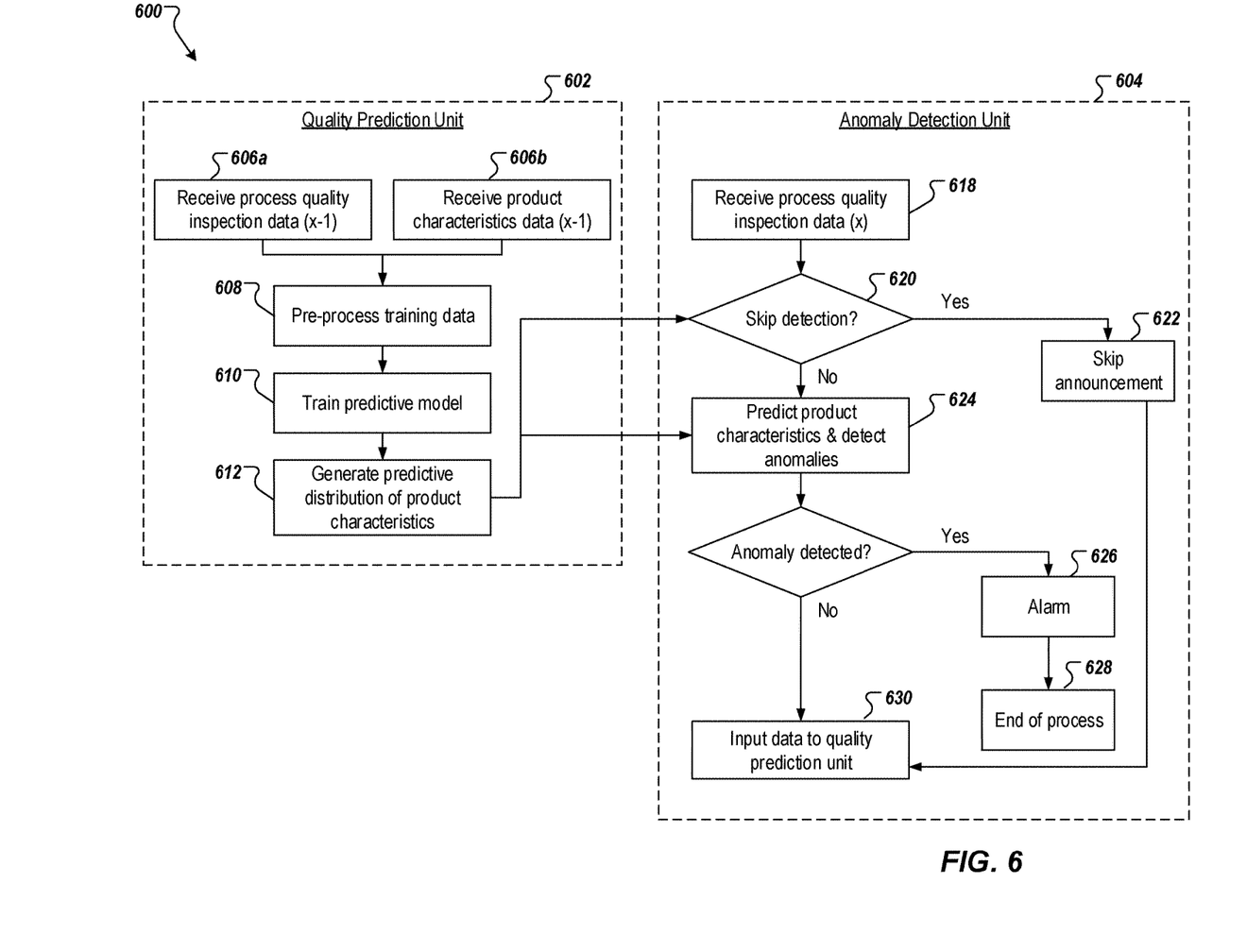
FIG. 6 depicts a further example of an anomaly detection system in accordance with implementations of the present disclosure.

FIG. 6 depicts a further example of an anomaly detection system 600 that can be used in system 200 of FIG. 2. The anomaly detection system 600 comprises a quality prediction unit 602 and an anomaly detection unit 604. The quality prediction unit 602 operates the same way as the quality prediction unit 302 in FIG. 3. However, at 612, the predictive model is used to generate a predictive distribution of the product characteristics that serves as input for two stages of the anomaly detection unit 604.

As in FIG. 3, the anomaly detection unit 604 is configured to execute a sequence of steps that uses the predictive distribution of the product characteristics to identify anomalies based on process quality inspection data. At 618, the anomaly detection unit 304 receives process quality inspection data of the wafers to be inspected. Before predicting the product characteristics associated with the quality inspection data x, the anomaly detection unit 604 determines at 620 whether to skip the prediction and anomaly detection. More specifically, the anomaly detection unit 604 receives the credible interval of the product characteristic from the quality prediction unit 602. If the model is based on a small number of data points, the predictive model will have a large credible interview that may trigger a large number of alarms (e.g., at 626). To suppress frequent alarms, the credible interval of the product characteristic is compared to a predetermined threshold. If the credible interval is larger than the threshold, the prediction and anomaly detection at 624 are skipped. For example, if the model has a 90% probability of generating a value between 1 and 999 for output data on the order of 50, the model can be considered too unreliable to use. If the anomaly detection unit 602 does not skip the prediction and anomaly detection, the prediction and anomaly detection proceeds in the same way as in FIG. 3 (320-326).

If the prediction and anomaly detection are skipped, a skip announcement is made at 622. For example, the skip announcement can be shown on the interface of a computing device such as computing device 102 in FIG. 1. The skip announcement can include a record of the particular process quality inspection data that was not subjected to anomaly detection for later review. Following the skip announcement, the process quality inspection data x is sent to the quality prediction unit 602 at 626 to update the predictive model.

Figure 7:
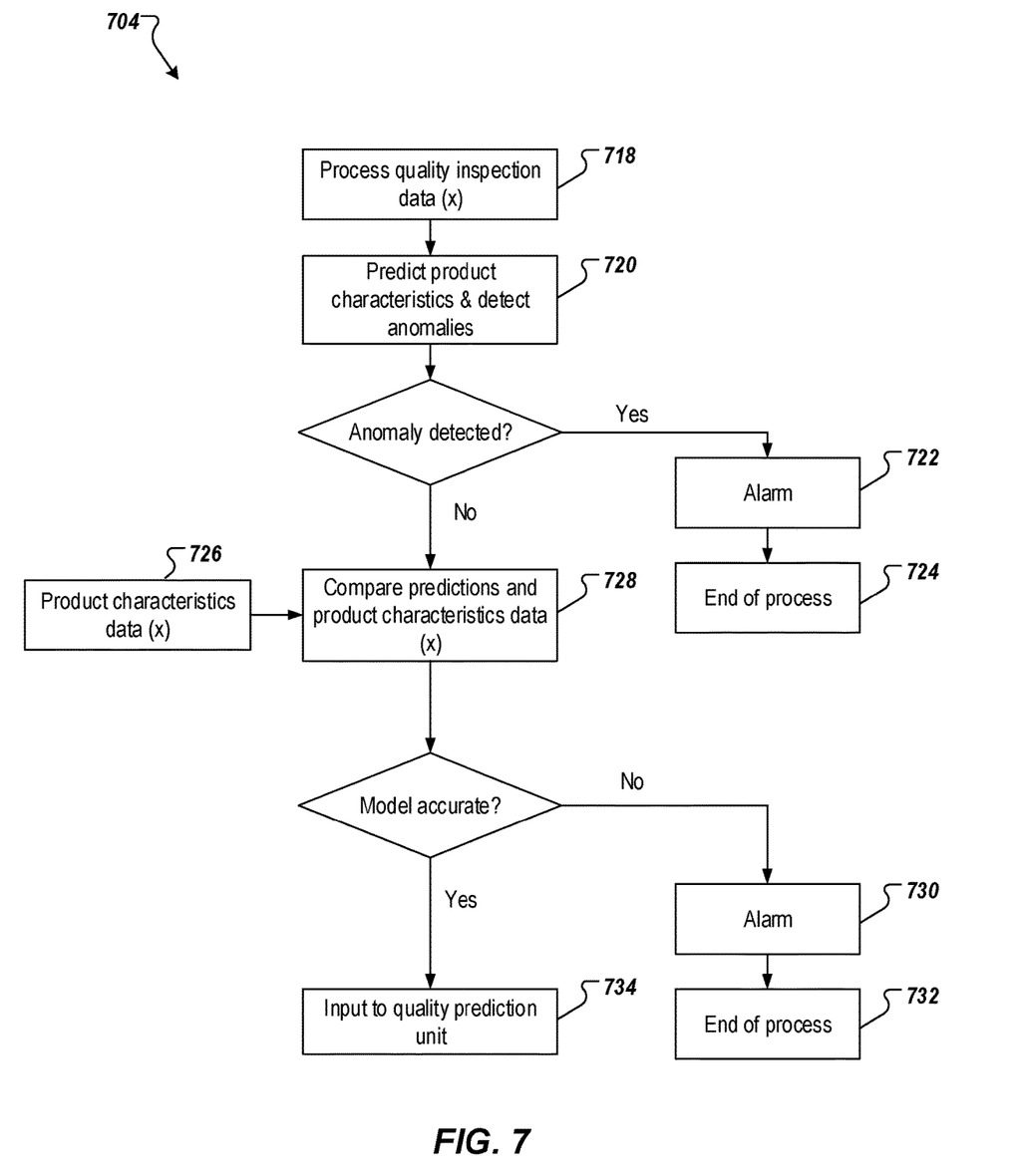
FIG. 7 depicts an example of an anomaly detection unit in accordance with implementations of the present disclosure.

FIG. 7 depicts an example of an anomaly detection unit 704 that can be combined, e.g., with the quality prediction unit 302 of FIG. 3 or the quality prediction unit 602 of FIG. 6 to form an anomaly detection system. Similarly to anomaly detection units 304, 604, the anomaly detection unit 704 receives process quality inspection data x at 718 and predicts product characteristics and detects anomalies based on this data at 720. If anomalies are detected, an alarm is triggered at 722, and the process ends at 724.

At 726, the anomaly detection unit 704 receives the product characteristics data x that corresponds to the product quality inspection data x. At 728, the predicted product characteristics data from 720 and the product characteristics data x are compared. Since the product characteristics data x is measured at the end of the fabrication process (FIG. 2), there may be a substantial time difference between 720 and 728. Based on the differences between the predicted and actual data, the user may determine that the model is inaccurate. For example, the user may compare the differences to a threshold based on the blur of past data. In this case, an alarm is triggered at 730, and the process is ended at 732. Otherwise, both the product quality inspection data x and the product characteristics data x are input to the quality prediction unit (not shown) at 734.

Figure 8:
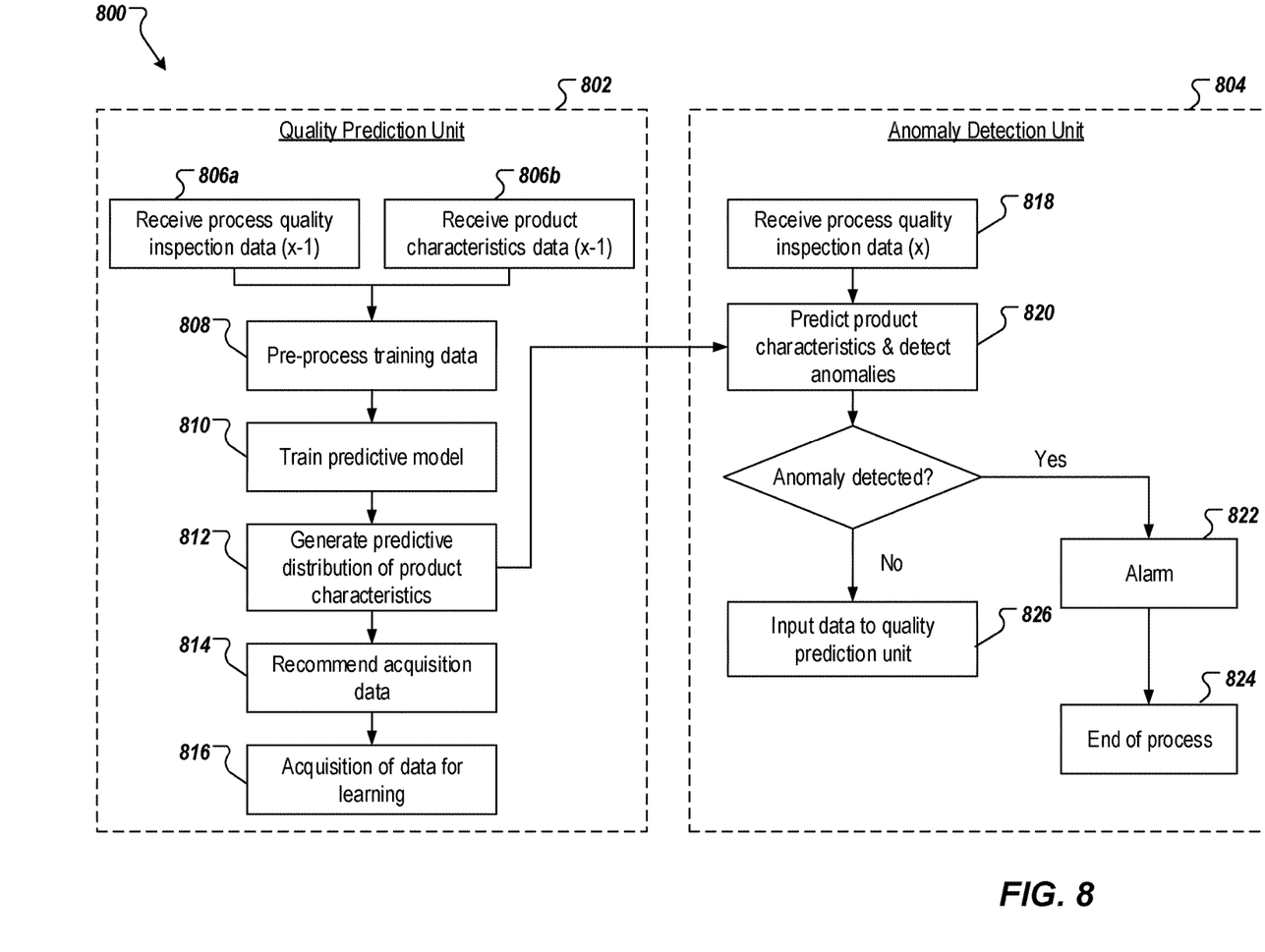
FIG. 8 depicts a further example of an anomaly detection system in accordance with implementations of the present disclosure.

FIG. 8 depicts a further example of an anomaly detection system 800 that can be used in system 200 of FIG. 2. The anomaly detection system 800 comprises a quality prediction unit 802 and an anomaly detection unit 804. The anomaly detection unit 804 operates the same way as the anomaly detection unit 304 in FIG. 3. Similarly to in FIG. 3, the quality prediction unit 802 receives process quality inspection data and product characteristics data at 806*a* and 806*b*. At 808, the past process quality inspection data and product characteristics data are pre-processed to form a training set. At 810, the training data are used to train a predictive model. The predictive model is a Gaussian process regression model that uses a bathtub kernel function, as described above. At 812, the predictive model is used to generate a predictive distribution of the product characteristics that serves as input for the anomaly detection unit 804.

At 814, the quality prediction unit 802 determines a combination of process quality inspection data to be learned in order to refine the predictive distribution of the product characteristics. For example, the quality prediction unit 802 can use Bayesian optimization to target data for which uncertainty and variance of the predictive distribution are high. At 816, the target values for the process quality inspection data that are indicated in 814 are acquired. For example, manufacturing process conditions can be manually or automatically adjusted to obtain the target values for the process quality inspection data. Obtaining such information can reduce uncertainty and increase the accuracy of the model. The specific adjustments depend on the type of process quality inspection data and the equipment that generates the data. For example, one or more operational parameters of a machine that have a known relationship with the process quality inspection data can be adjusted so the output values approach the target values.

Thus, the accuracy of the predictive model can be refined with a relatively small amount of training data, since the Gaussian process regression model can indicate the specific data necessary to improve model accuracy. This effect is particularly pronounced when the relationship between the predictive distribution of product characteristics and the process quality inspection data is complex.

In general, semiconductor devices are often designed to meet product characteristics as long as the process quality inspection data falls within a certain range. For example, in the process of forming vias that connect the different layers, the design rules are defined to ensure that the misalignment with the lower layers has a certain margin of error. Since semiconductor manufacturing processes typically involve hundreds of steps, design rules are often unable to account for complex interactions between multiple factors. The electrical characteristics are often simulated at the design stage under worst-case conditions that take manufacturing variation into account to ensure that there are no problems. Nonetheless, it is difficult to determine the worst conditions that account for all possible manufacturing variations. It is also difficult to obtain accurate relationships between multiple process quality inspection data and product characteristics data from a physical model, since semiconductor manufacturing processes involve so many steps and factors and also include product-specific issues, such as device layout dependence. Accordingly, product characteristics may degrade in an unexpected manner once manufacturing actually begins.

For example, if multiple factors, such as long gate lengths and high drain and source wiring resistance, cause transistors to shift their characteristics toward the slow side during the manufacturing process, even if all of the process quality inspection data for each process fall within the control values, the analog circuits can be expected to behave in an unpredictable manner. In such a case, abnormalities cannot be detected during in-line quality testing. Therefore, the abnormality is not noticed until the final wafer testing process, which takes about three months. If the cause of the abnormality is unclear, all the wafers that have passed through the process become defective or suspicious, which causes significant quality loss costs and delivery problems.

Thus, the methods and systems of the present disclosure treat process quality inspection data that are expected to have a significant impact, such as gate length and via diameter, as input for predicting analog circuit characteristic values (e.g., ring oscillator frequency) as characteristic data. In this way, it is possible to determine whether or not the corresponding circuit of the wafer meets the specifications when the process quality inspection data is acquired.

Implementations and all of the functional operations described in this specification may be realized in digital electronic circuitry, or in computer software, firmware, or hardware, including the structures disclosed in this specification and their structural equivalents, or in combinations of one or more of them. Implementations may be realized as one or more computer program products, i.e., one or more modules of computer program instructions encoded on a computer readable medium for execution by, or to control the operation of, data processing apparatus. The computer readable medium may be a machine-readable storage device, a machine-readable storage substrate, a memory device, a composition of matter effecting a machine-readable propagated signal, or a combination of one or more of them. The term "computing system" encompasses all apparatus, devices, and machines for processing data, including by way of example a programmable processor, a computer, or multiple processors or computers. The apparatus may include, in addition to hardware, code that creates an execution environment for the computer program in question (e.g., code that constitutes processor firmware, a protocol stack, a database management system, an operating system, or any appropriate combination of one or more thereof). A propagated signal is an artificially generated signal (e.g., a machine-generated electrical, optical, or electromagnetic signal) that is generated to encode information for transmission to suitable receiver apparatus.

A computer program (also known as a program, software, software application, script, or code) may be written in any appropriate form of programming language, including compiled or interpreted languages, and it may be deployed in any appropriate form, including as a stand alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry (e.g., an FPGA (field programmable gate array) or an ASIC (application specific integrated circuit)).

Processors suitable for the execution of a computer program include, by way of example, both general and special purpose microprocessors, and any one or more processors of any appropriate kind of digital computer. Generally, a processor will receive instructions and data from a read only memory or a random access memory or both. Elements of a computer can include a processor for performing instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks). However, a computer need not have such devices. Moreover, a computer may be embedded in another device (e.g., a mobile telephone, a personal digital assistant (PDA), a mobile audio player, a Global Positioning System (GPS) receiver). Computer readable media suitable for storing computer program instructions and data include all forms of non-volatile memory, media and memory devices, including by way of example semiconductor memory devices (e.g., EPROM, EEPROM, and flash memory devices); magnetic disks (e.g., internal hard disks or removable disks); magneto optical disks; and CD ROM and DVD-ROM disks. The processor and the memory may be supplemented by, or incorporated in, special purpose logic circuitry.

To provide for interaction with a user, implementations may be realized on a computer having a display device (e.g., a CRT (cathode ray tube), LCD (liquid crystal display) monitor) for displaying information to the user and a keyboard and a pointing device (e.g., a mouse, a trackball, a touch-pad), by which the user may provide input to the computer. Other kinds of devices may be used to provide for interaction with a user as well; for example, feedback provided to the user may be any appropriate form of sensory feedback (e.g., visual feedback, auditory feedback, tactile feedback); and input from the user may be received in any appropriate form, including acoustic, speech, or tactile input.

Implementations may be realized in a computing system that includes a back end component (e.g., as a data server), a middleware component (e.g., an application server), and/or a front end component (e.g., a client computer having a graphical user interface or a Web browser, through which a user may interact with an implementation), or any appropriate combination of one or more such back end, middleware, or front end components. The components of the system may be interconnected by any appropriate form or medium of digital data communication (e.g., a communication network). Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

What is claimed is:

1. A computer-implemented method for detecting anomalies of products during lot production, wherein the products within a production lot are processed according to a sequence of steps that include manufacturing steps and one or more quality control steps interspersed among the manufacturing steps, the method comprising:

performing a first manufacturing step for products in a first production lot, the products comprising a first set of semiconductor wafers, the first manufacturing step at least partially forming one or more electronic circuits on each of the semiconductor wafers of the first set of semiconductor wafers;

executing one or more quality control steps after the first manufacturing step;

obtaining process quality inspection data from each of the one or more quality control steps for the first production lot;

obtaining product characteristics data for products in the first production lot after a final step in the sequence of steps;

training a Gaussian process regression model using the process quality inspection data and the product characteristics data from the first production lot;

generating a predictive distribution of the product characteristics data using the Gaussian process regression model that uses a bathtub kernel function, wherein the bathtub kernel function is defined as:

$$k(x_i, x_j) = \int \varphi(x, \theta) \varphi(x, \theta) d\theta,$$

where $\varphi(x, \theta)$ is a bathtub function and $\theta$ represents the parameters $\theta = [\alpha_1, \beta_1, \gamma_1, \alpha_2, \beta_2, \gamma_2, \delta]$, wherein the bathtub function can be expressed as $$\varphi(x, \theta) = \alpha_1 \cdot sig(\beta_1' x + \gamma_1) + \alpha_2 \cdot sig(\beta_2' x + \gamma_2) + \delta$$

wherein $\alpha_i$ determines the depth of the bathtub function, $\beta_i$ determines the steepness of the sides of the bathtub function, $\gamma_i$ determines the width of the bathtub function, and $\delta$ determines the overall height of the bathtub function, and $\alpha_i, \beta_i, \gamma_i,$ and $\delta$ are real numbers, i.e., $\alpha_1, \beta_1, \gamma_1, \alpha_2, \beta_2, \gamma_2, \delta \in R$;

performing the first manufacturing step for products in a second production lot, the products comprising a second set of semiconductor wafers, the first manufacturing step at least partially forming one or more electronic circuits on each of the semiconductor wafers of the second set of semiconductor wafers;

after performing the first manufacturing step, obtaining process quality inspection data from a quality control step for the second production lot;

processing, using the predictive distribution of the product characteristics data, the process quality inspection data for the second production lot to detect any anomalous products in the second production lot;

if no anomalies are detected in the second production lot, updating the Gaussian process regression model using the process quality inspection data from the second production lot;

setting target values for one or more values in the process quality inspection data based on the predictive distribution of the product characteristic; and adjusting settings of one or more manufacturing steps based on the target values.

2. The method of claim 1, further comprising:

comparing a credible interval for the predictive distribution of the product characteristics data to a pre-determined threshold; and if the credible interval is above the threshold, using the process quality inspection data for the second production lot to train the Gaussian process regression model without identifying anomalies in the second production lot.

3. The method of claim 2, further comprising:

generating a skipped announcement that includes the process quality inspection data for the second production lot.

4. The method of claim 1, further comprising:

obtaining product characteristics data for the products in the second production lot after the final step in the sequence;

determining a difference between the predictive distribution of the product characteristics data and the obtained product characteristics data;

comparing the difference to a pre-determined threshold; and triggering an alarm if the difference is larger than the pre-determined threshold.

5. The method of claim 4, further comprising:

updating the Gaussian process regression model using the process quality inspection data and the product characteristics data from the second production lot if the difference is smaller than the pre-determined threshold.

6. The method of claim 1, further comprising:

identifying process quality inspection data to be learned in order to refine the predictive distribution of the product characteristic;

adjusting settings of one or more manufacturing steps based on the identified process quality inspection data;

acquiring the identified process quality inspection data; and training the Gaussian process regression model using the acquired process quality inspection data.

7. The method of claim 1, wherein the lot production is wafer fabrication, and wherein the product characteristics data are obtained by wafer testing.

8. A system, comprising:

one or more processors; and a computer-readable storage device coupled to the one or more processors and having instructions stored thereon which, when executed by the one or more processors, cause the one or more processors to perform operations comprising:

performing a first manufacturing step for products in a first production lot, the products comprising a first set of semiconductor wafers, the first manufacturing step at least partially forming one or more electronic circuits on each of the semiconductor wafers of the first set of semiconductor wafers;

executing one or more quality control steps after the first manufacturing step;

obtaining process quality inspection data from each of one or more quality control steps for a first production lot;

obtaining product characteristics data for products in the first production lot after a final step in a sequence of steps;

training a Gaussian process regression model using the process quality inspection data and the product characteristics data from the first production lot;

generating a predictive distribution of the product characteristics data using the Gaussian process regression model that uses a bathtub kernel function, wherein the bathtub kernel function is defined as:

$k(x_i,x_j)=\int \varphi(x,\theta)\varphi(x,\theta)d\theta,$ where $\varphi(x, \theta)$ is a bathtub function and $\theta$ represents the parameters $\theta=[\alpha_1, \beta_1, \gamma_1, \alpha_2, \beta_2, \gamma_2, \delta]$, wherein the bathtub function can be expressed as $\varphi(x,\theta)=\alpha_1 \cdot sig(\beta_1'x+\gamma_1)+\alpha_2 \cdot sig(\beta_2'x+\gamma_2)+\delta$ wherein $\alpha_i$ determines the depth of the bathtub function, $\beta_i$ determines the steepness of the sides of the bathtub function, $\gamma_i$ determines the width of the bathtub function, and $\delta$ determines the overall height of the bathtub function, and $\alpha_i$, $\beta_i$, $\gamma_i$, and $\delta$ are real numbers, i.e., $\alpha_1, \beta_1, \gamma_1, \alpha_2, \beta_2, \gamma_2, \delta \in R$;

performing the first manufacturing step for products in a second production lot, the products comprising a second set of semiconductor wafers, the first manufacturing step at least partially forming one or more electronic circuits on each of the semiconductor wafers of the second set of semiconductor wafers;

after performing the first manufacturing step, obtaining process quality inspection data from a quality control step for the second production lot;

processing, using the predictive distribution of the product characteristics data, the process quality inspection data for the second production lot to detect any anomalous products in the second production lot;

if no anomalies are detected in the second production lot, updating the Gaussian process regression model using the process quality inspection data from the second production lot;

setting target values for one or more values in the process quality inspection data based on the predictive distribution of the product characteristic; and adjusting settings of one or more manufacturing steps based on the target values.

9. The system of claim 8, the operations further comprising:

comparing a credible interval for the predictive distribution of the product characteristics data to a pre-determined threshold; and if the credible interval is above the threshold, using the process quality inspection data for the second production lot to train the Gaussian process regression model without identifying anomalies in the second production lot.

10. The system of claim 9, the operations further comprising:
   generating a skipped announcement that includes the process quality inspection data for the second production lot.

11. The system of claim 8, the operations further comprising:
   obtaining product characteristics data for the products in the second production lot after the final step in the sequence;
   determining a difference between the predictive distribution of the product characteristics data and the obtained product characteristics data;
   comparing the difference to a pre-determined threshold; and
   triggering an alarm if the difference is larger than the pre-determined threshold.

12. The system of claim 11, the operations further comprising:
   updating the Gaussian process regression model using the process quality inspection data and the product characteristics data from the second production lot if the difference is smaller than the pre-determined threshold.

13. The system of claim 8, the operations further comprising:
   identifying process quality inspection data to be learned in order to refine the predictive distribution of the product characteristic;
   adjusting settings of one or more manufacturing steps based on the identified process quality inspection data;
   acquiring the identified process quality inspection data; and
   training the Gaussian process regression model using the acquired process quality inspection data.

14. The system of claim 8, the operations further comprising:
   obtaining the product characteristics data by wafer testing in a wafer fabrication process.

15. Non-transitory computer-readable storage media coupled to one or more processors and having instructions stored thereon which, when executed by the one or more processors, cause the one or more processors to perform operations comprising:
   performing a first manufacturing step for products in a first production lot, the products comprising a first set of semiconductor wafers, the first manufacturing step at least partially forming one or more electronic circuits on each of the semiconductor wafers of the first set of semiconductor wafers;
   executing one or more quality control steps after the first manufacturing step;
   obtaining process quality inspection data from each of one or more quality control steps for a first production lot;
   obtaining product characteristics data for products in the first production lot after a final step in a sequence of steps;
   training a Gaussian process regression model using the process quality inspection data and the product characteristics data from the first production lot;
   generating a predictive distribution of the product characteristics data using the Gaussian process regression model that uses a bathtub kernel function, wherein the bathtub kernel function is defined as:

$$k(x_i, x_j) = \int \varphi(x, \theta) \varphi(x, \theta) d\theta,$$

where $\varphi(x, \theta)$ is a bathtub function and $\theta$ represents the parameters $\theta = [\alpha_1, \beta_1, \gamma_1, \alpha_2, \beta_2, \gamma_2, \delta]$, wherein the bathtub function can be expressed as $$\varphi(x, \theta) = \alpha_1 \cdot sig(\beta_1' x + \gamma_1) + \alpha_2 \cdot sig(\beta_2' x + \gamma_2) + \delta$$

wherein $\alpha_i$ determines the depth of the bathtub function, $\beta_i$ determines the steepness of the sides of the bathtub function, $\gamma_i$ determines the width of the bathtub function, and $\delta$ determines the overall height of the bathtub function, and $\alpha_i, \beta_i, \gamma_i$, and $\delta$ are real numbers, i.e., $\alpha_1, \beta_1, \gamma_1, \alpha_2, \beta_2, \gamma_2, \delta \in R$;

performing the first manufacturing step for products in a second production lot, the products comprising a second set of semiconductor wafers, the first manufacturing step at least partially forming one or more electronic circuits on each of the semiconductor wafers of the second set of semiconductor wafers;
after performing the first manufacturing step, obtaining process quality inspection data from a quality control step for the second production lot;
processing, using the predictive distribution of the product characteristics data, the process quality inspection data for the second production lot to detect any anomalous products in the second production lot;
if no anomalies are detected in the second production lot, updating the Gaussian process regression model using the process quality inspection data from the second production lot;
setting target values for one or more values in the process quality inspection data based on the predictive distribution of the product characteristic; and
adjusting settings of one or more manufacturing steps based on the target values.

16. The non-transitory computer-readable storage media of claim 15, the operations further comprising:
   comparing a credible interval for the predictive distribution of the product characteristics data to a pre-determined threshold; and
   if the credible interval is above the threshold, using the process quality inspection data for the second production lot to train the Gaussian process regression model without identifying anomalies in the second production lot.

17. The non-transitory computer-readable storage media of claim 15, the operations further comprising:
   obtaining product characteristics data for the products in the second production lot after the final step in the sequence;
   determining a difference between the predictive distribution of the product characteristics data and the obtained product characteristics data;
   comparing the difference to a pre-determined threshold; and
   triggering an alarm if the difference is larger than the pre-determined threshold.

* * * * *